United States Patent
Lin et al.

(10) Patent No.: US 6,330,905 B1
(45) Date of Patent: Dec. 18, 2001

(54) HEAT SINK ASSEMBLY

(75) Inventors: Yeu-Lih Lin, Taiepi; Aimin Huang, ShenZhen, both of (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/686,207

(22) Filed: Oct. 10, 2000

(30) Foreign Application Priority Data

Sep. 14, 2000 (TW) ................................................ 89215869

(51) Int. Cl.[7] ....................................................... H05K 7/20
(52) U.S. Cl. ........................ 165/80.3; 165/121; 165/185; 257/719; 361/697; 361/704
(58) Field of Search ................... 165/80.3, 121, 165/185; 174/16.3; 257/718, 719, 722; 361/697, 704

(56) References Cited

U.S. PATENT DOCUMENTS

| | | | |
|---|---|---|---|
| 5,677,829 | * 10/1997 | Clemens | ................................ 361/697 |
| 5,724,228 | * 3/1998 | Lee | ........................................ 361/697 |
| 5,943,209 | * 8/1999 | Liu | .................................... 361/697 X |
| 6,199,624 | * 3/2001 | Wotring | ............................... 165/80.3 |

* cited by examiner

*Primary Examiner*—Leonard Leo
(74) *Attorney, Agent, or Firm*—Wei Te Chung

(57) ABSTRACT

A heat sink assembly includes a heat sink (60), a fan (20) and a fixing device (70). The heat sink has a plurality of fins (64). The outermost fins define catches (66). The fixing device includes an upper portion (10) and a lower portion (30). The upper and lower portions respectively define upper and lower openings (14, 36) providing air flow access for the fan. A pole (18) depends from each corner of the upper portion. The fan has first through holes (22) for extension of the poles therethrough. A pair of latches (38) extends upwardly from the lower portion, for engaging with the upper portion. The upper portion defines two cutouts (16) in communication with the upper opening, for receiving the latches. A side wall (50) depends from each of two opposite sides of the lower portion. Each side wall defines two recess (54) at respective opposite ends thereof. A barb (52) is formed at each opposite end of each side wall, for engaging with the corresponding catch of the heat sink.

12 Claims, 5 Drawing Sheets

HEAT SINK ASSEMBLY

BACKGROUND

1. Field of the Invention

The present invention relates to a heat sink assembly, and particularly to a heat sink assembly having a fixing device for readily and firmly attaching a fan to a heat sink.

2. The Related Art

During operation of an electronic device of a computer system, a large amount of heat is often produced. The heat must be quickly removed from the electronic device, to prevent the computer system from becoming unstable or being damaged. Typically, a heat sink is attached to an outer surface of the electronic device to facilitate removal of heat therefrom. Fans are often attached to the heat sink to provide forced convection therefrom.

A conventional means for attaching a fan to a heat sink is by using screws. Referring to FIG. 6, each of four corners of a fan 2 defines a through hole. A heat sink 1 forms threading corresponding to the through holes of the fan 2. Screws 3 extend through the through holes and engage with the threadings of the heat sink 1, thereby attaching the fan 2 to the heat sink 1. However, installation and removal of the fan requires a tool such as a screwdriver. This makes the process cumbersome and complicated. Moreover, aluminum chips may be torn off the threadings of an aluminum heat sink as the screws 3 are rotated during installation. Such loose chips can migrate to other parts of the computer system during installation or use, where they may cause malfunction or damage. Furthermore, this mode lacks generality because it can only be used in heat sink of a given size and given configuration heat sink.

Thus a heat sink assembly which overcomes the above problems of the prior art is desired.

SUMMARY OF THE INVENTION

Accordingly, an object of the present invention is to provide a heat sink assembly having a fixing device which firmly attaches a fan to a heat sink.

Another object of the present invention is to provide a heat sink assembly which is readily assembled and disassembled.

To achieve the above-mentioned objects, a heat sink assembly comprises a heat sink, a fan and a fixing device. The heat sink has a plurality of parallel fins. The outermost fins define internal catches. The fixing device comprises a rectangular upper portion and a rectangular lower portion. The upper and lower portions respectively define upper and lower openings providing air flow access for the fan. A pole depends vertically from each corner of the upper portion. The fan has through holes for the extension of the poles therethrough. A pair of latches extends upwardly from opposite sides of the lower portion, for engaging with the upper portion. The upper portion defines two opposed cutouts in communication with the opening, for receiving the latches. A side wall depends from each of two opposite sides of the lower portion. Each side wall defines two recess at respective opposite ends thereof. A barb is formed at each opposite end of each side wall, for engaging with the corresponding catch of the heat sink.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
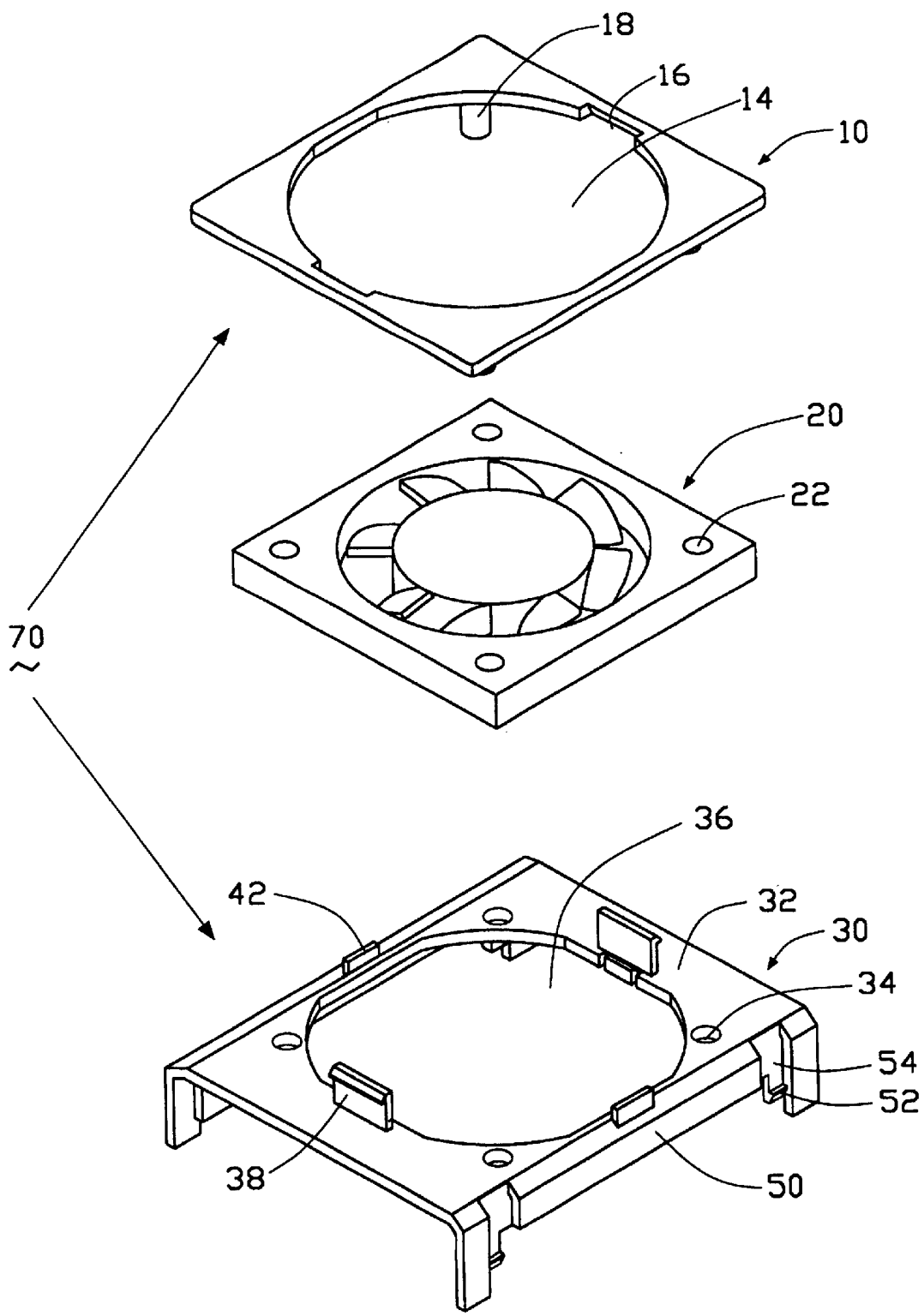
FIG. 1 is an exploded view of a fixing device in accordance with the present invention together with a fan.
Figure 4:
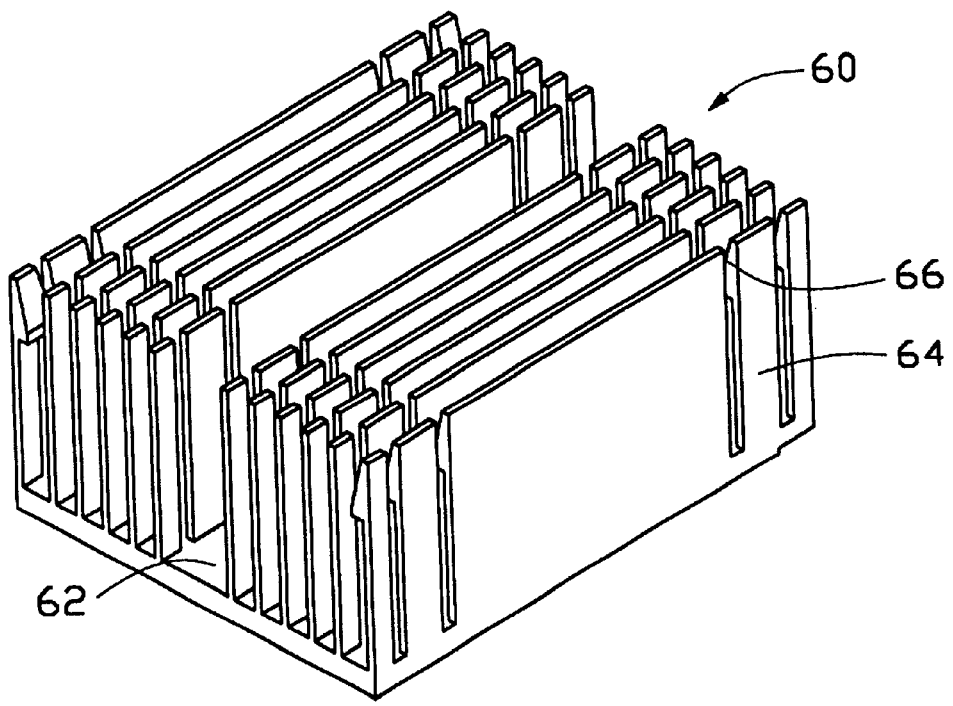
FIG. 4 is a perspective view of a heat sink in accordance with the present invention.

Referring to FIG. 1, a fixing device 70 of the present invention is used to attach a fan 20 to a heat sink 60 (see FIG. 4). The fan 20 is generally rectangular, with a vertical first through hole 22 defined in each corner thereof.

The fixing device 70 includes an upper portion 10 and a lower portion 30. The upper portion 10 is generally rectangular. The center of the upper portion 10 defines a large upper opening 14, for providing air flow access for the fan 20. The upper portion 10 defines two opposing cutouts 16, each cutout 16 being in communication with the upper opening 14. A pole 18 depends vertically from a bottom surface (not labeled) of the upper portion 10 at each corner thereof, corresponding to each first through hole 22 of the fan 20.

Figure 2:
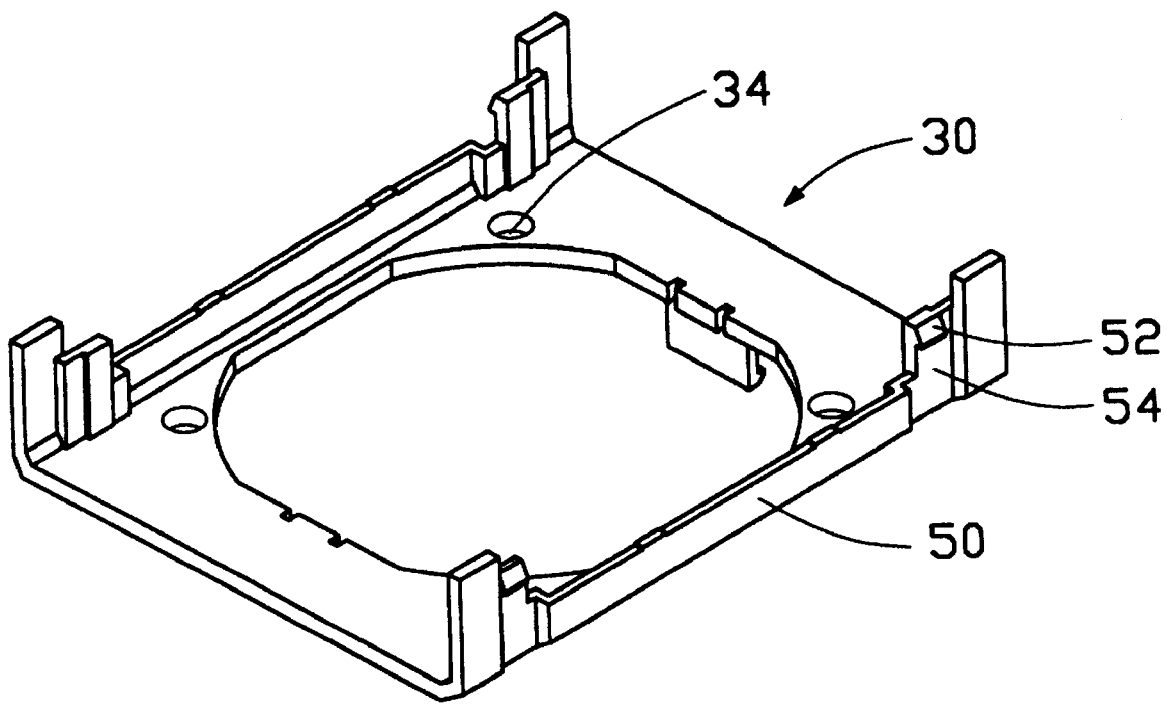
FIG. 2 is a view of a lower portion of the fixing device of FIG. 1, but now inverted.

The lower portion 30 has a generally rectangular base 32. The base 32 defines a second through hole 34 at each corner thereof, corresponding to each first through hole 22 of the fan 20. The center of the base 32 defines a large lower opening 36, for providing air flow access for the fan 20. A pair of latches 38 extends upwardly from respective opposite sides of the base 32, corresponding to the cutouts 16 of the upper portion 10. A pair of protrusions 42 respectively extends upwardly from the other two opposite sides of the lower portion 30. Two side walls 50 depend vertically from respective opposite sides of the lower portion 30, adjacent the protrusions 42. Two recesses 54 are defined in respective opposite ends of each side wall 50 (see also FIG. 2). A pair of external barbs 52 is formed at respective opposite ends of each side wall 50. Each barb 52 is adjacent a lower limit of its corresponding recess 54.

Figure 3:
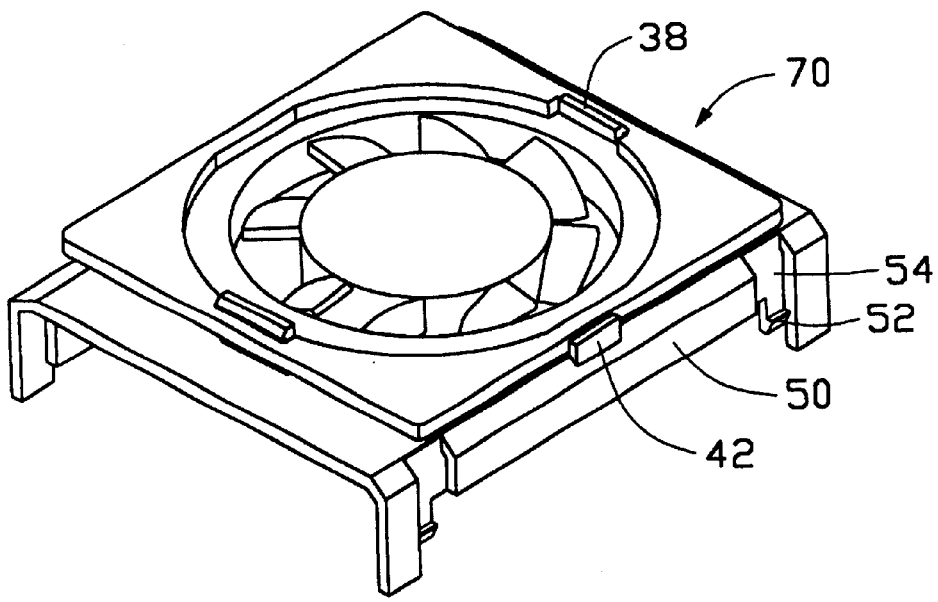
FIG. 3 is an assembled view of FIG. 1.

Referring to FIG. 3, in assembly, the poles 18 of the upper portion 10 respectively extend through the first through holes 22 of the fan 20, and then enter the second through holes 34 of the lower portion 30. The latches 38 of the lower portion 30 abut against respective opposite sides (not labeled) of the fan 20, and extend through the cutouts 16 to engage with the upper portion 10. The protrusions 42 abut against the other two opposite sides of the fan 20, to prevent the fan 20 from moving in a lateral direction.

Figure 5:
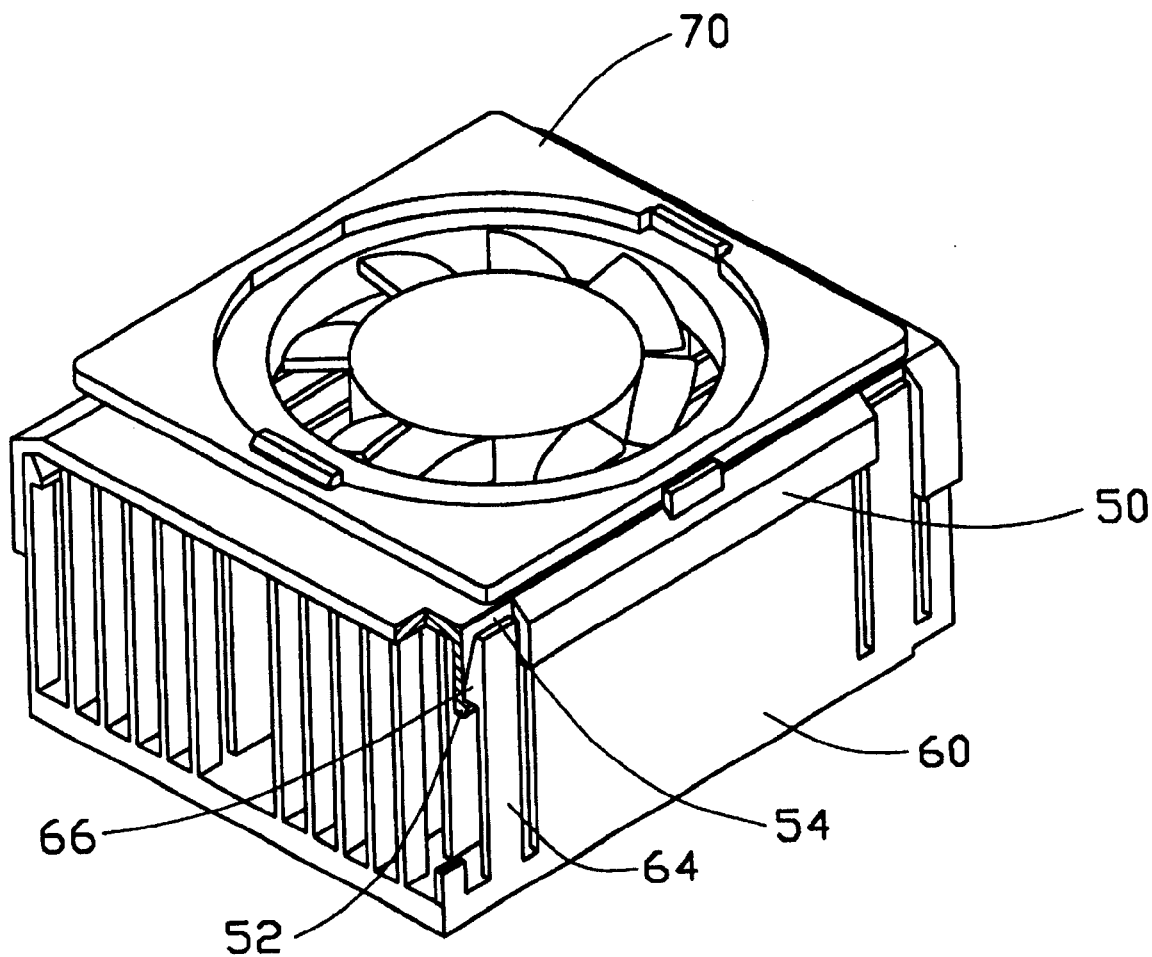
FIG. 5 is an assembled view of the fixing device attached to the heat sink.
Figure 6:
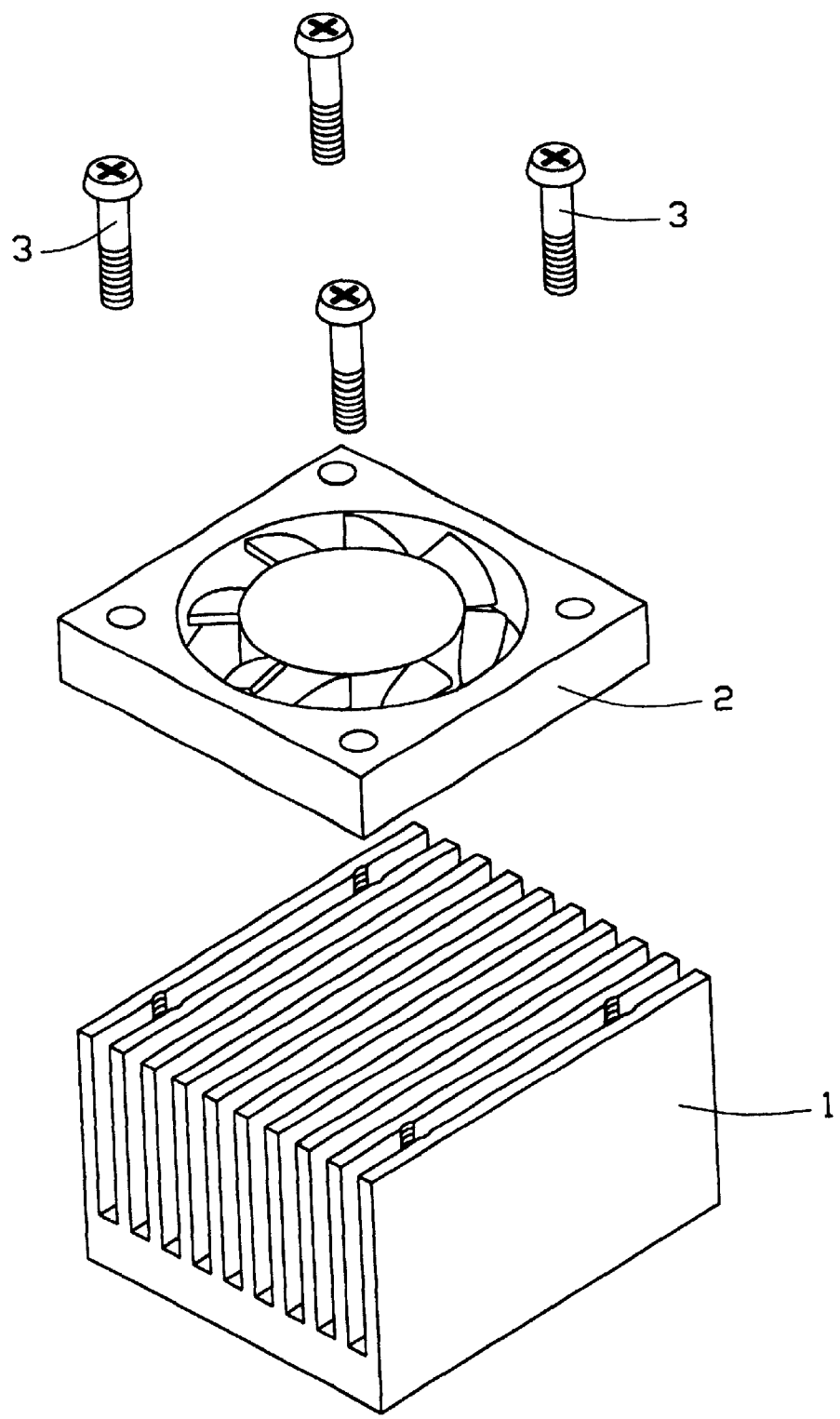
FIG. 6 is an exploded view of conventional means of attaching a fan to a heat sink using screws.

Referring to FIGS. 4 and 5, the heat sink 60 includes a chassis 62 and a plurality of parallel fins 64 extending vertically from a top surface (not labeled) of the chassis 62. The outermost fins 64 define internal catches 66 corresponding to the barbs 52 of the lower portion 30. In attaching the fixing device 70 to the heat sink 60, the barbs 52 of the lower portion 30 engage with the catches 66 of the heat sink 60. Thus the fixing device 70 is securely attached to the heat sink 60.

The whole assembly process is simple and convenient. Furthermore, when a heat sink of different size and/or configurations used, only the lower portion 30 needs to be replaced to make the entire fixing device 70 fully operational. Thus the fixing device 70 is highly versatile.

Moreover, since the fixing device 70 does not need screws to secure the fan to the heat sink, the risk of accidental damage to the heat sink during assembly is minimized.

It is understood that the invention may be embodied in other forms without departing from the spirit thereof thus, the present example and embodiment are to be considered in all respects illustrative and not restrictive, and the invention is not to be limited to the details given herein.

What is claimed is:

1. A heat sink assembly comprising:
   a heat sink having a plurality of fins at least two fins formed with a catch;
   a fan; and
   a fixing device comprising an upper portion and a lower portion with the fan interposed therebetween, the upper and lower portions respectively defining upper and lower openings providing air flow access for the fan, the lower portion forming at least two latches for engaging with the upper portion thereby securing the fan between the upper and lower portions, and the lower portion having at least two barbs engaging with the at least two catches of the fins thereby securing the lower portion to the heat sink.

2. The heat sink assembly as described in claim 1, wherein the upper portion forms at least a pole, and the fan defines at least a first through hole for extension of the pole therethrough.

3. The heat sink assembly as described in claim 2, wherein the lower portion defines at least a second through hole for extension of the pole therethrough.

4. The heat sink assembly as described in claim 1, wherein the upper portion defines at least two cutouts in communication with the upper opening, for receiving the at least two latches of the lower portion.

5. The heat sink assembly as described in claim 1, wherein at least a pair of protrusions extends upwardly from respective opposite sides of the lower portion, the protrusions abutting respective opposite sides of the fan.

6. The heat sink assembly as described in claim 1, wherein at least a pair of side walls depends from respective opposite sides of the lower portion, the side walls abutting respective outermost fins of the heat sink.

7. The heat sink assembly as described in claim 6, wherein the at least two barbs are respectively formed in the opposite side walls of the lower portion, and the at least two catches are respectively formed in opposite outermost fins of the heat sink.

8. The heat sink assembly as described in claim 7, wherein at least two recesses are respectively defined in the opposite side walls adjacent the at least two barbs, for facilitating engagement of the barbs with the catches of the heat sink.

9. A heat sink assembly comprising:
   a heat sink including a plurality of fins thereon;
   a fan; and
   a fixing device including spaced upper and lower portions with said fan interposed therebetween, the upper portion and the lower portion respectively defining upper and lower openings providing air flow access for the fan;
   means for retaining the fan in position in the fixing device;
   means for holding the upper portion and the lower portion together; and
   means for securing one of said upper portion and the said lower portion to the heat sink.

10. The assembly as described in claim 9, wherein the means for retaining the fan includes at least one pole extending through a hole of the fan.

11. The assembly as described in claim 9, wherein the means for holding the upper portion and the lower portion includes at least one latch formed on one of the upper portion and the lower portion and latchably engaged with the other.

12. The assembly as described in claim 9, wherein the means for securing to the heat sink includes at least one barb of the fixing device and one catch formed on the heat sink.

\* \* \* \* \*